United States Patent
Tompkins et al.

(10) Patent No.: US 9,801,295 B2
(45) Date of Patent: Oct. 24, 2017

(54) REMOTE CONTROL UNIT WITH LANYARD ATTACHMENT MECHANISM

(71) Applicant: Oculus VR, LLC, Menlo Park, CA (US)

(72) Inventors: Glen Jason Tompkins, Woodinville, WA (US); Peter Wesley Bristol, Seattle, WA (US); Blake Francis Andersen, Snoqualmie, WA (US)

(73) Assignee: Oculus VR, LLC, Menlo Park, CA (US)

( * ) Notice: Subject to any disclaimer, the term of this patent is extended or adjusted under 35 U.S.C. 154(b) by 50 days.

(21) Appl. No.: 14/934,102

(22) Filed: Nov. 5, 2015

(65) Prior Publication Data

US 2017/0135233 A1    May 11, 2017

(51) Int. Cl.
    *H05K 5/02*      (2006.01)
    *A45F 5/00*      (2006.01)
    *H05K 5/03*      (2006.01)

(52) U.S. Cl.
    CPC ............. *H05K 5/0217* (2013.01); *A45F 5/00* (2013.01); *H05K 5/03* (2013.01); *A45F 2005/006* (2013.01)

(58) Field of Classification Search
    CPC   H05K 5/0217; H05K 5/03; A45F 5/00; A45F 2005/006; A47K 5/05; Y10T 24/316; Y10T 24/318; Y10T 24/31
    USPC ........................... 361/679.01, 679.3, 679.56; 455/575.1–575.8; 224/191; 248/686, 693
    See application file for complete search history.

(56) References Cited

U.S. PATENT DOCUMENTS

| | | | |
|---|---|---|---|
| 4,574,285 | A | 3/1986 | Bascou |
| 5,422,783 | A | 6/1995 | Darbee et al. |
| 5,504,658 | A | 4/1996 | Matsuda et al. |
| 5,704,087 | A | 1/1998 | Strub |
| 5,801,918 | A | 9/1998 | Ahearn et al. |
| 5,805,423 | A | 9/1998 | Wever et al. |
| 6,633,483 | B2 | 10/2003 | Akagi et al. |
| 6,988,664 | B1 | 1/2006 | Lee et al. |
| 7,091,899 | B2 | 8/2006 | Imamura et al. |
| D570,793 | S | 6/2008 | Ikeda et al. |
| D571,305 | S | 6/2008 | Thursfield et al. |
| D578,079 | S | 10/2008 | Huang et al. |
| 7,435,508 | B2 | 10/2008 | Lee et al. |
| 7,456,777 | B2 | 11/2008 | Piekarz et al. |

(Continued)

OTHER PUBLICATIONS

Blain, L., "'Ancient' Oculus Rift concepts leak new controller and front-facing camera," gamesradar+, retrieved online from <http://www.gamesradar.com/new-oculus-rift-and-its-fancy-new-controller/>,dated Jun. 9, 2015.

(Continued)

*Primary Examiner* — Steven T Sawyer
*Assistant Examiner* — Sagar Shrestha
(74) *Attorney, Agent, or Firm* — Perkins Coie LLP (57) ABSTRACT

Remote control units with lanyard attachment mechanisms are disclosed. A handheld remote control assembly can include an anchor member, a lanyard coupled to the anchor member, and a device to be carried by the lanyard. The device includes a body and a receptacle formed in the body, the receptacle configured to receive the anchor member therein. A housing can removably cover the receptacle to secure the anchor member in place, and a notch in the housing receives a portion of the lanyard therethrough.

17 Claims, 7 Drawing Sheets

(56) References Cited

U.S. PATENT DOCUMENTS

| | | | |
|---|---|---|---|
| D593,509 S | 6/2009 | Glassman et al. | |
| D597,038 S | 7/2009 | Glassman et al. | |
| 7,586,732 B2 | 9/2009 | Myers et al. | |
| D602,916 S | 10/2009 | Won et al. | |
| D605,177 S | 12/2009 | Madonna et al. | |
| 7,839,627 B2 | 11/2010 | Fukui et al. | |
| 7,916,460 B2 | 3/2011 | Henty et al. | |
| 7,929,297 B2* | 4/2011 | Chen | H04M 1/026 310/215 |
| D645,848 S | 9/2011 | Arnholt et al. | |
| 8,018,726 B2 | 9/2011 | Friedlander et al. | |
| 8,068,332 B2* | 11/2011 | Yang | H04M 1/0202 224/254 |
| 8,072,737 B2 | 12/2011 | Glover et al. | |
| 8,199,492 B2* | 6/2012 | Liang | H04M 1/0202 242/164 |
| 8,411,424 B2* | 4/2013 | Hsiung | A45C 13/30 24/115 R |
| D688,232 S | 8/2013 | Zhang et al. | |
| 8,570,718 B2* | 10/2013 | Gao | H04M 1/026 224/254 |
| D693,332 S | 11/2013 | Lee et al. | |
| D728,530 S | 5/2015 | Shin et al. | |
| D742,361 S | 11/2015 | Choi et al. | |
| 9,176,578 B2 | 11/2015 | Nomura et al. | |
| D746,266 S | 12/2015 | Kwon et al. | |
| D752,025 S | 3/2016 | Akana et al. | |
| D752,555 S | 3/2016 | Langhammer et al. | |
| 9,298,255 B2 | 3/2016 | Kimura | |
| D772,821 S | 11/2016 | Bristol et al. | |
| D790,484 S | 6/2017 | Bristol et al. | |
| 2001/0035442 A1* | 11/2001 | Yokobori | A45C 13/26 224/197 |
| 2003/0201903 A1 | 10/2003 | Shen et al. | |
| 2003/0224243 A1 | 12/2003 | Maeda et al. | |
| 2004/0196621 A1 | 10/2004 | Nakamura et al. | |
| 2004/0237308 A1 | 12/2004 | Mitchell | |
| 2005/0270735 A1 | 12/2005 | Chen et al. | |
| 2008/0190528 A1* | 8/2008 | Steinberg | H01H 9/0242 150/165 |
| 2008/0219657 A1* | 9/2008 | Suzuki | G03B 17/563 396/423 |
| 2008/0283651 A1* | 11/2008 | Ito | A45F 5/004 242/386 |
| 2009/0156990 A1 | 6/2009 | Wenger | |
| 2009/0185071 A1* | 7/2009 | Suzuki | G03B 17/02 348/375 |
| 2009/0303670 A1 | 12/2009 | Enomoto et al. | |
| 2010/0007517 A1 | 1/2010 | Andrews et al. | |
| 2010/0033911 A1* | 2/2010 | Chang | H05K 5/0243 361/679.01 |
| 2010/0035666 A1* | 2/2010 | Chang | H04B 1/3888 455/575.1 |
| 2010/0102576 A1* | 4/2010 | Zhang | A45F 5/00 292/261 |
| 2010/0118476 A1* | 5/2010 | Li | A45F 3/14 361/679.01 |
| 2010/0165554 A1* | 7/2010 | Dong | H04M 1/0202 361/679.01 |
| 2010/0191078 A1 | 7/2010 | Yodfat | |
| 2010/0238640 A1 | 9/2010 | Yang et al. | |
| 2010/0304797 A1* | 12/2010 | Yang | A45F 5/00 455/575.1 |
| 2010/0328857 A1* | 12/2010 | Dong | H04M 1/026 361/679.01 |
| 2011/0304469 A1 | 12/2011 | Rutter | |
| 2013/0149566 A1 | 6/2013 | Yau | |
| 2013/0176243 A1 | 7/2013 | BianRosa et al. | |
| 2014/0184386 A1 | 7/2014 | Regler | |
| 2015/0022956 A1 | 1/2015 | Olson | |
| 2015/0109721 A1 | 4/2015 | Willcocks et al. | |
| 2015/0138070 A1 | 5/2015 | Iwatsu | |
| 2015/0234189 A1 | 8/2015 | Lyons et al. | |
| 2015/0235435 A1 | 8/2015 | Abovitz et al. | |
| 2015/0262475 A1 | 9/2015 | Helmy | |
| 2016/0035136 A1 | 2/2016 | Sendai | |
| 2016/0286943 A1* | 10/2016 | Andersen | A61F 11/12 |
| 2017/0135236 A1 | 5/2017 | Tompkins et al. | |
| 2017/0170446 A1 | 6/2017 | Tompkins et al. | |

OTHER PUBLICATIONS

First Examiner's Report dated Feb. 25, 2016, for Australian Patent Application No. 201516613 by Bristol, P. et al., filed Dec. 8, 2015.
First Examiner's Report dated Feb. 25, 2016, for Australian Patent Application No. 201516615 by Bristol, P. et al., filed Dec. 8, 2015.
First Examiner's Report dated Apr. 5, 2016, for Canadian Patent Application No. 167,210 by Bristol, P. et al., filed Jul. 6, 2015.
First Examiners Report dated Feb. 4, 2016, for Israeli Design Patent Application No. 57746 by Bristol, P. et al., filed Nov. 26, 2015.
First Examiner's Report dated Mar. 18, 2016, for Indian Design Patent Application No. 278150 by Bristol, P. et al., filed Dec. 7, 2015.
First Examiner's Report dated Mar. 18, 2016, for Indian Design Patent Application No. 278169 by Bristol, P. et al., filed Dec. 8, 2015.
First Examiner's Report dated Nov. 19, 2015, for Canadian Patent Application No. 163,149 by Bristol, P. et al., filed Jul. 6, 2015.
Lang, B., "Oculus Rift Input Controller Revealed in Leaked 'Placehold Concept," Road Tovr, retrieved online at <http://www.roadtovr.com/oculus-rift-input-controller-revealed-in-leaked-placeholder-concept/>, dated Jun. 9, 2015.
Notification of Reasons for Rejection dated Apr. 1, 2016 in Japanese Patent Application No. 2015027702 by Bristol, P., et al., filed Dec. 11, 2015.
Notification of Reasons for Rejection dated Apr. 1, 2016 in Japanese Patent Application No. 2015027703 by Bristol, P., et al., filed Dec. 11, 2015.
Orland, K., "Leaked images could point to Oculus controller, final Rift design," arsTechnica, retrieved online from <http://arstechnica.com/gaming/2015/06/leaked-images-could-point-to-oculus-controller-final-rift-design/>, dated Jun. 10, 2015.
Restriction Requirement dated Jun. 17, 2016, for U.S. Appl. No. 29/529,911 by Bristol, P., et al., filed Jun. 11, 2015.
U.S. Appl. No. 14/935,358 by Tompkins, G., et al., filed Nov. 6, 2015.
U.S. Appl. No. 14/967,130 by Tompkins, G., et al., filed Dec. 11, 2015.
U.S. Appl. No. 29/529,911 by Bristol, P., et al., filed Jun. 11, 2015.
Non-Final Office Action dated Jul. 28, 2016, for U.S. Appl. No. 14/967,130 by Tompkins, G. et al., filed Dec. 11, 2015.
Notice of Preliminary Rejection dated May 19, 2016 in Korean Patent Application No. 30-2015-0063435 by Bristol, P., et al., filed Dec. 11, 2015.
Notice of Allowance dated Sep. 8, 2016, for U.S. Appl. No. 29/529,911 by Bristol, P. et al., filed Jun. 11, 2015.
U.S. Appl. No. 29/576,052 by Bristol, P., et al., filed Aug. 31, 2016.
Notice of Allowance dated Mar. 20, 2017, for U.S. Appl. No. 14/967,130 by Tompkins, G. et al., filed Dec. 11, 2015.
Notice of Allowance dated Mar. 21, 2017 for U.S. Appl. No. 29/576,052 by Bristol, P., et al., filed Aug. 31, 2016.
Office Action dated Mar. 14, 2017 in Mexican Patent Application No. MX/f/2015/003771, by Bristol, P., et al. filed Dec. 11, 2015.
Notice of Allowance dated Apr. 21, 2017 of U.S. Appl. No. 14/935,358 by Tompkins, G., et al., filed Nov. 6, 2015.
Non-Final Office Action dated Feb. 23, 2017, for U.S. Appl. No. 14/935,358 by Tompkins, G. et al., filed Nov. 6, 2015.
Notice of Preliminary Rejection dated Apr. 11, 2017 in Korean Patent Application No. 30-2016-0048541 by Bristol, P., et al., filed Dec. 11, 2015.
U.S. Appl. No. 29/606,522 by Bristol, P., et al., filed Jun. 5, 2017.
Corrected Notice of Allowability dated May 5, 2017 for U.S. Appl. No. 29/576,052 by Bristol, P., et al., filed Aug. 31 2016.

* cited by examiner

REMOTE CONTROL UNIT WITH LANYARD ATTACHMENT MECHANISM

TECHNICAL FIELD

This patent application is directed to wireless electronic mechanisms, including handheld electronic devices with lanyard attachment mechanisms.

BACKGROUND

Lanyards can be attached to an item, such as a remote control or other handheld electronic devices. Lanyards provide a convenient handle or restraint, allowing the user to carry the item by the lanyard or to place the lanyard around the user's wrist while holding the item to safeguard against unintentionally dropping or losing it. Typically, lanyards are affixed to a clip or other structure that protrudes out of the side of the remote control unit. Alternatively, lanyards are integrally formed with the remote control unit, which reduces the ability to replace or modify the lanyard as desired.

BRIEF DESCRIPTION OF THE DRAWINGS

Embodiments of the handheld electronic device with a lanyard attachment mechanism introduced herein may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments.

DETAILED DESCRIPTION

Overview

A handheld electronic device with a lanyard and a lanyard attachment mechanism is disclosed. The lanyard is molded into an anchor member. The anchor member fits within a receptacle formed in the handheld electronic device to which the lanyard is attached. In some embodiments, the anchor member is cylindrical in shape and fits into a cylindrical receptacle in the body of the handheld electronic device. A cover is attached to the handheld electronic device's body to capture the anchor member within the handheld electronic device. The cover can include a notch to provide clearance for the portion of the lanyard extending from the anchor member in the receptacle.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIGS. 1-4 are isometric, front, rear, and exploded views, respectively, of a handheld electronic device 101 coupled to a lanyard 103. The handheld electronic device 101 is illustrated and described throughout as a remote control device, however in other embodiments the handheld electronic device 101 can take other forms or perform other functions. For example, in some embodiments the handheld electronic device 101 can be any small, portable electronic device, such as a media player, smartphone, camera, an RFID transponder, or other electronic device.

Referring to FIGS. 1-4 together, the device 101 has a substantially oblong shape, with the lanyard 103 extending from a lower portion 105 of the device 101. The lanyard 103 can be a cord, string, wire, band, or other such elongated material that extends away from the device 101 and provides a convenient structure for gripping, securing, or otherwise retaining the device 101.

The device 101 includes a front housing 107 that mates with a corresponding rear housing 109. The front housing 107 includes a plurality of openings 111a-e that receive, respectively, a plurality of user input controls 113a-e therethrough. For example, the first user input control 113a can include a touch-sensitive surface that allows a user to provide input via touching or moving the user's finger across a touch-sensitive surface of the control 113a, and/or by depressing a button portion of the control 113a. Second and third user input controls 113b and 113c are volume-down and volume-up buttons, respectively, while the fourth user input control 113d provides a return or "back" function. The fifth user input control 113e is a power button. In other embodiments the user input controls can take a variety of configurations, including other touch-sensitive surfaces, depressible-buttons, or any other input mechanism.

Figure 1:
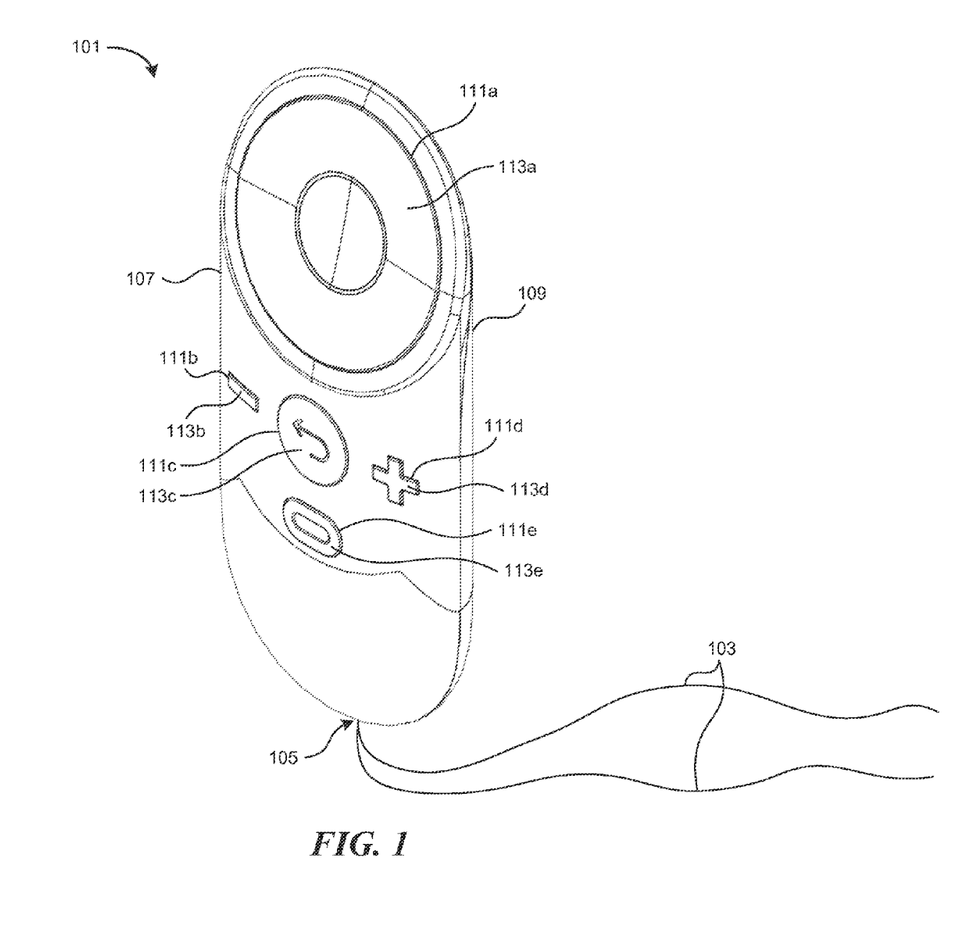
FIG. 1 is an isometric view of a handheld electronic device with a lanyard in accordance with aspects of the present technology.
Figure 2:
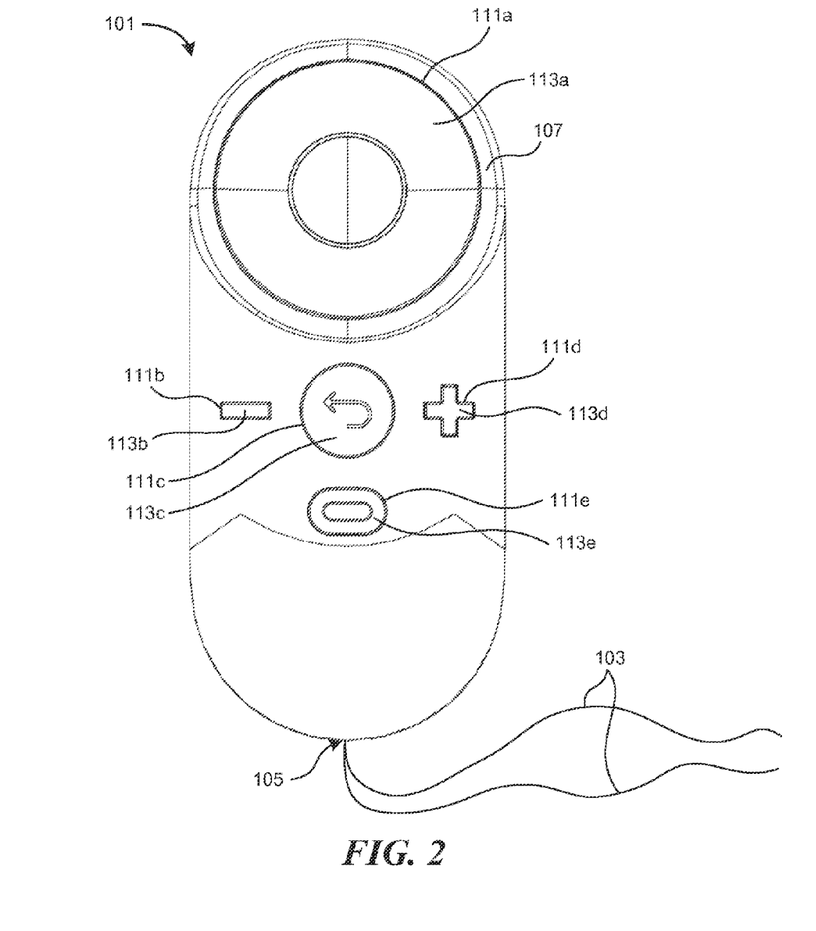
FIG. 2 is a front plan view of the handheld electronic device and lanyard of FIG. 1.
Figure 3:
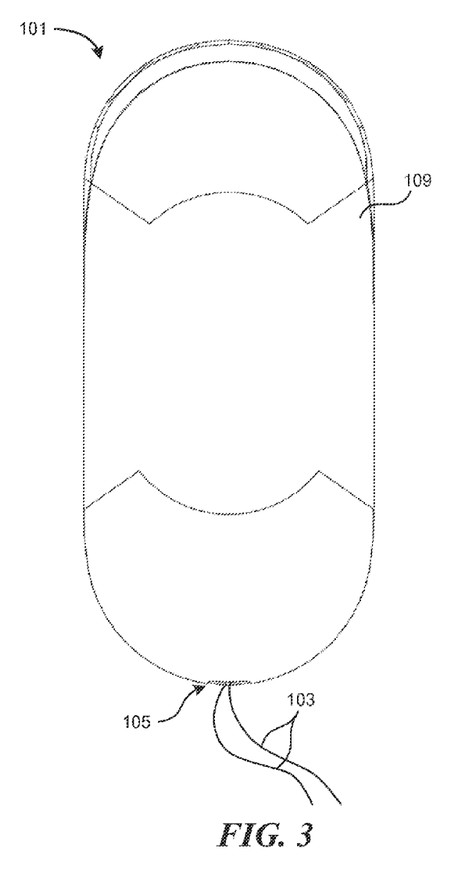
FIG. 3 is a rear plan view of the handheld electronic device and lanyard of FIGS. 1 and 2.
Figure 4:
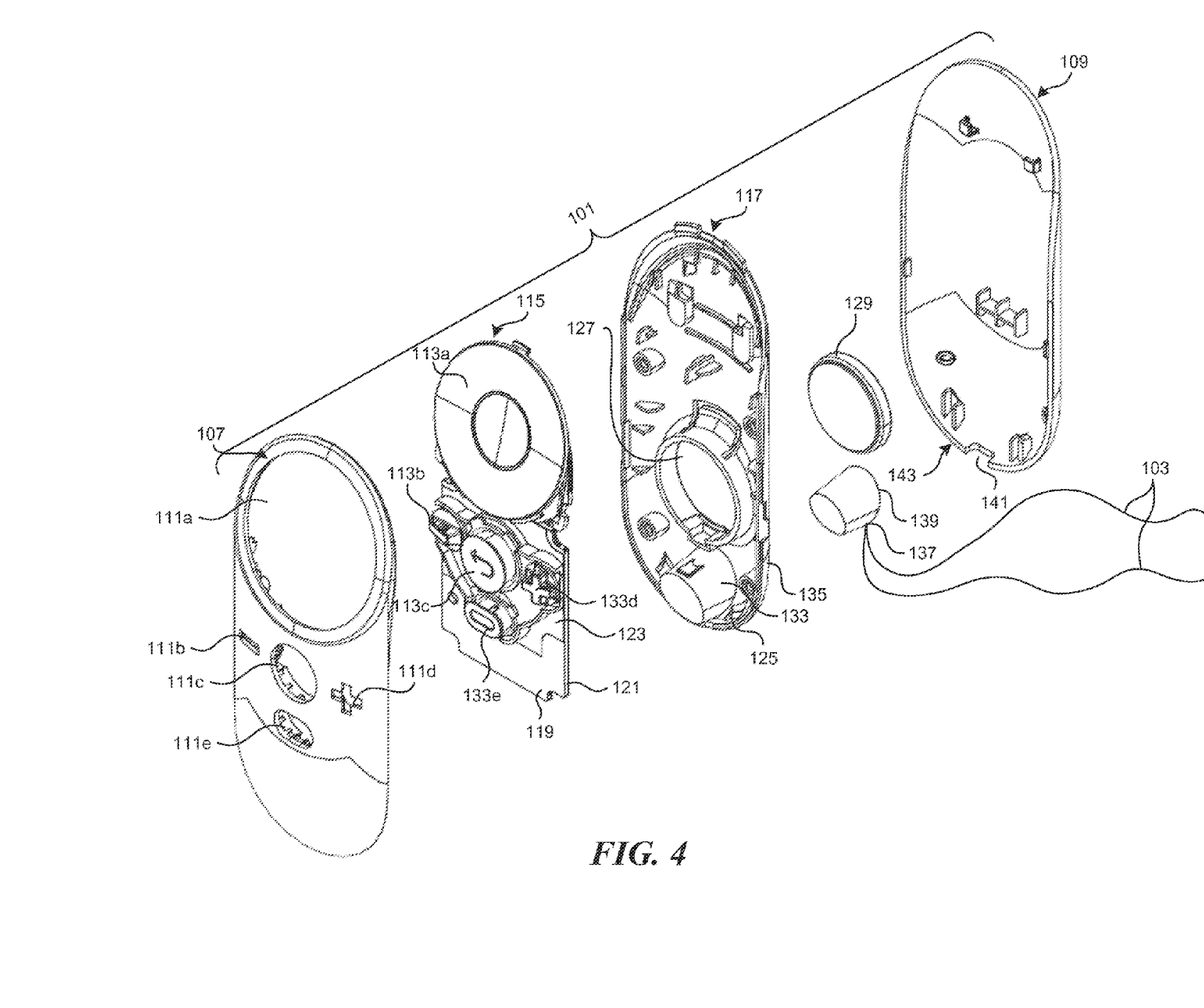
FIG. 4 is an exploded perspective view of the handheld electronic device and lanyard of FIGS. 1-3.

Sandwiched between the front housing 107 and the rear housing 109 are an internal control assembly 115 and a support body portion 117. The internal control assembly 115 includes the plurality of input controls 113a-e on a front side 119 that faces toward the front housing 107. The control assembly 115 can include a printed circuit board 123, carrying associated electronics configured to process user input provided via the controls 113*a-e* and perform various other electronic functions of the device 101.

The support body portion 117 has a front side 125 that mates with the internal control assembly 115. The support body portion 117 also includes an access aperture 127 that provides access to a portion of the backside 121 of the control assembly 115 having connection terminals 131*a*, 131*b* (FIG. 7) that releasably receive a battery 129. Accordingly, the battery 129 can be installed through the access aperture 127 when the rear housing 109 is removed from the support body portion 117. The support body portion 117 further includes a lanyard receptacle 133 formed in a back side 135 of the support body portion 117 adjacent to the access aperture 127.

As seen in FIG. 4, the lanyard 103 is fixed at a first end 137 to an anchor member 139. In some embodiments, the first end 137 of the lanyard 103 is integrally molded into the anchor member 139. In other embodiments, the first end 137 of the lanyard 103 can be fixed to the anchor member 139 in other ways, such as an additional fastener, an adhesive, or other such approach. The anchor member 139 is configured to be removably received within the receptacle 133 of the support body portion 117. The receptacle 133 of the illustrated embodiment has a substantially cylindrical shape with an inner diameter, and the anchor member 139 has a corresponding substantially cylindrical shape with an outer diameter just slightly less than the receptacle's inner diameter to permit the anchor member 139 to be slidably and snuggly inserted into and removed from the receptacle 133. The anchor member 139 includes a first surface, a second surface, and a sidewall extending between the first surface and the second surface. The first surface is sloped with respect to the second surface. When inserted within the receptacle 133, the first surface faces the bottom of the receptacle and the second surface faces away from the receptacle 133. The slope of the second surface corresponds to the portion of the support body portion 117 surrounding the receptacle 133, such that when inserted within the receptacle 133, the second surface of the anchor member is substantially coplanar with the portion of the support body portion 117 surrounding the receptacle 133. Although the illustrated embodiment shows a substantially cylindrical receptacle 133 and anchor member 139, other embodiments can have a mating receptacle 133 and anchor member 139 with other shapes, such as cuboid, frustoconical, polyhedron, or other selected shapes. A notch 141 is formed in a lower portion 143 of the rear housing 109.

Figure 5:
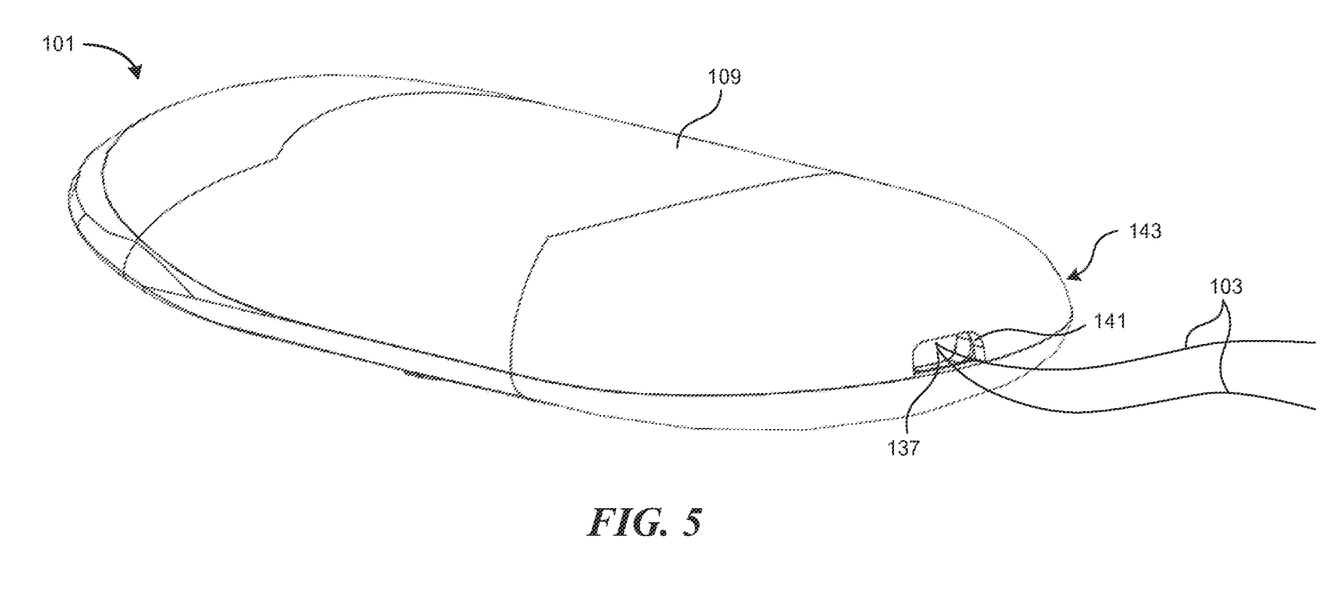
FIG. 5 is a lower rear perspective view of the handheld electronic device and lanyard of FIGS. 1-4.
Figure 6:
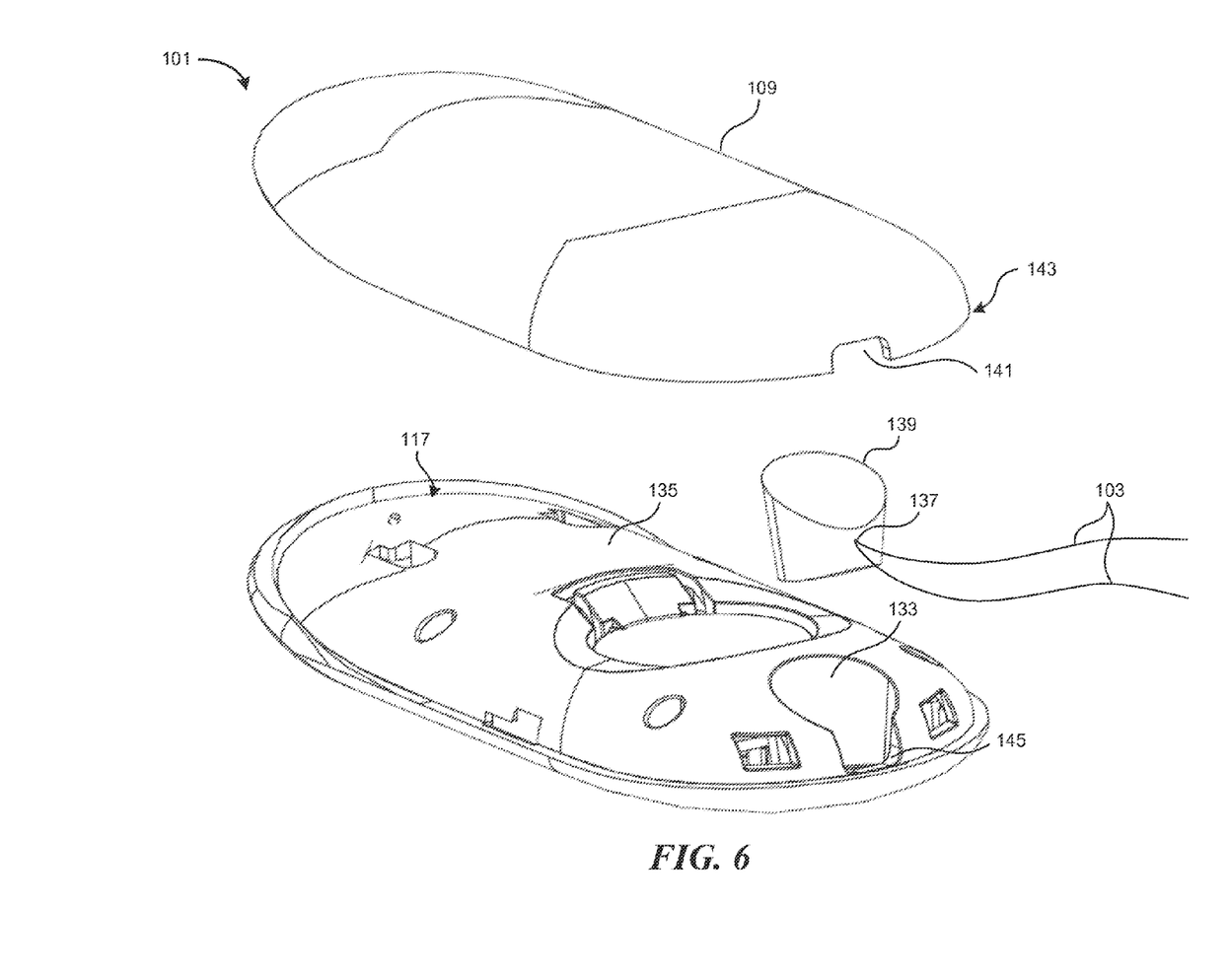
FIG. 6 is a partially exploded lower rear perspective view of the handheld electronic device and lanyard of FIGS. 1-5.

Referring to FIGS. 5 and 6 together, the anchor member 139 is removably inserted into the receptacle 133 with a snug friction fit therebetween so the anchor member 139 is in an installed position and substantially does not move radially relative to the support body portion 117. When the anchor member 139 is in the installed position, the lanyard 103 extends away from the anchor member 139 and away from a lower portion of the support body portion. The rear housing 109 is removably fastened to the front housing 107, such that the rear housing 109 covers the rear side of the support body portion 117 and covers the anchor member 139 in the installed position. Accordingly, the rear housing 109 blocks the anchor member 139 from moving axially out of the receptacle 133 away from the installed position. In at least one embodiment, the anchor member 139 is retained in the receptacle by a friction fit and/or the rear housing. In other embodiments, an additional fastener can be used to help retain the anchor member 139 in the receptacle when the rear housing 109 is removed from the support body portion to expose the anchor member 139. For example, the anchor member 139 can be fastened in the installed position by a screw, clip, hook-and-loop, or other fastener or fastening mechanism.

In the illustrated embodiment, the anchor member 139, the support body portion 117 at the receptacle 133, and the rear housing 109 are configured to accommodate the lanyard 103 extending from the anchor member 139. For example, the lanyard 103 is molded or otherwise fixedly attached to the anchor member 139 and projects radially away from the cylindrical sidewall of the anchor member 139. In another embodiment, the lanyard can be positioned to extend away from the circular end wall of the anchor member 139, or from another selected portion of the anchor member 139. The substantially cylindrical receptacle 133 has an open slot 145 on one side that permits the lanyard 103 to extend therethrough when the anchor member 139 is in the installed position. When the device 101 is assembled, the slot 145 in the receptacle 133 is substantially aligned with a notch 141 formed in the end of the rear housing 109. As a result, when the anchor member 139 is in the installed position in the receptacle 133 and the rear housing 109 is fitted over the support body portion 117, a portion of the lanyard 103 extends from the anchor member 139, through the slot 145 in the receptacle, and through the notch 141 in the rear housing 109. The notch 141 is large enough to receive the lanyard 103 therethrough but small enough that the anchor member 139 cannot pass through. The lanyard and anchor member 139 can be removed as a unit, for example if the lanyard needs to be replaced, by removing the rear housing 109 to expose the rear side of the support body portion 117, and lifting the anchor member out of the receptacle 133 and away from the installed position to a removed position. A new lanyard 103 and anchor member 139 can be quickly and easily installed into the receptacle 133 and the rear housing 109 re-attached to the front housing 107 (FIG. 4) such that the lanyard 103 extends through the slot 145 and the notch 141.

Figure 7:
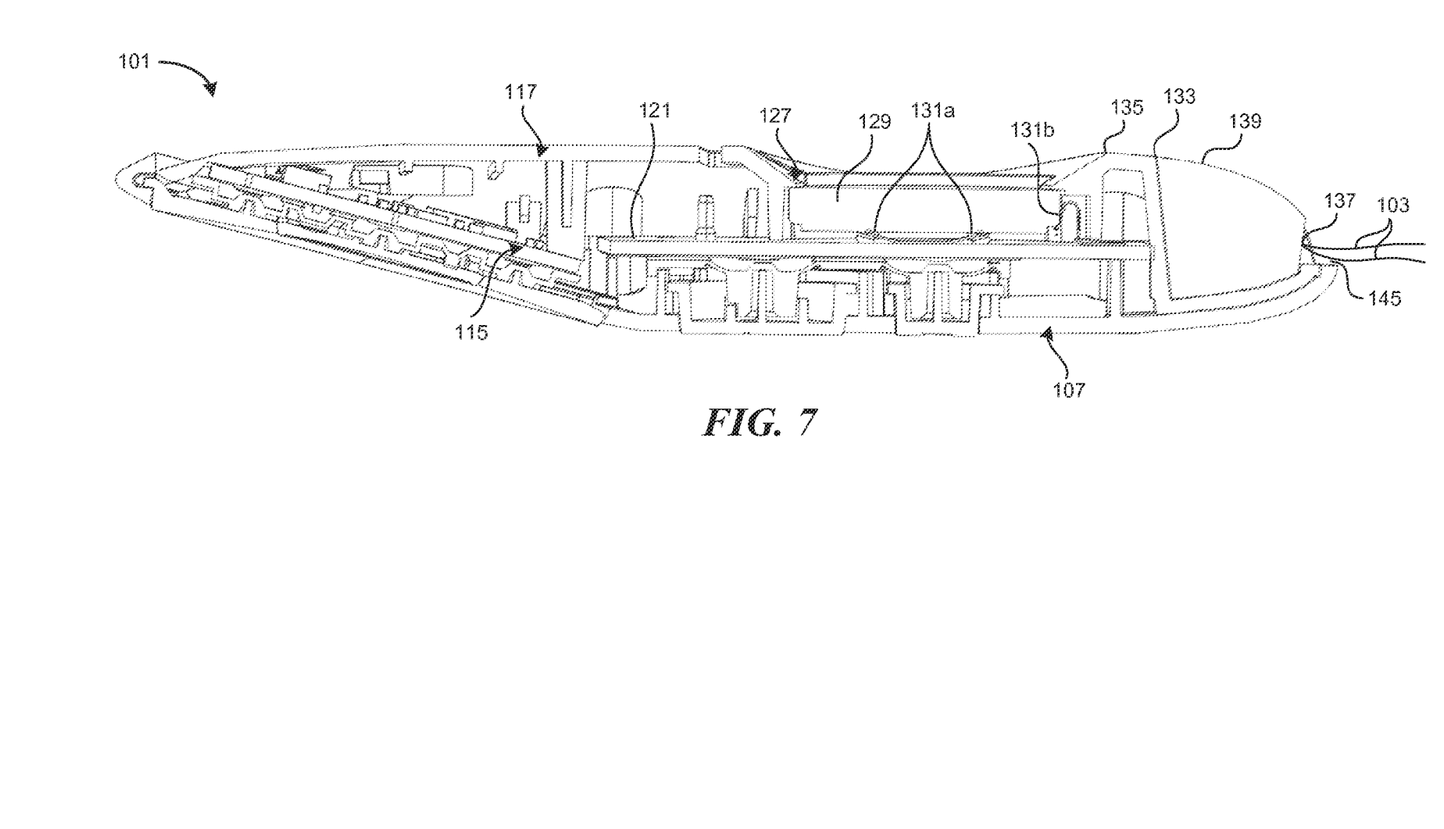
FIG. 7 is a side cross-section of the handheld electronic device and lanyard of FIGS. 1-6 with the rear housing not shown for purposes of clarity.

FIG. 7 is a side cross-section of the device 101 and lanyard 103 of FIGS. 1-6, with the rear housing 109 removed. As illustrated, the anchor member 139 is received within the receptacle 133, which is formed in the support body portion 117 of the device 101. The lanyard 103 is fixed to the anchor member 139 at a first end 137 and extends away from the anchor member 139 through the slot 145 in the receptacle 133. The battery 129 is received within the access aperture 127 in the support body portion 117, and abuts the connection terminals 131*a* and 131*b* disposed on the back side 121 of the internal control assembly 115. Since the anchor member 139 and the associated lanyard 103 can be removed from the receptacle 133, different lanyards coupled to different anchor members can be quickly and easily substituted for a given device.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. A handheld remote control assembly, comprising:
an anchor member having a top surface, a bottom surface, and a side surface extending between the top surface and the bottom surface, wherein the top surface is sloped with respect to the bottom surface;
a lanyard coupled to the anchor member such that a portion of the lanyard is molded into the anchor member;
a device comprising:
a body;
a receptacle formed in the body, the anchor member removably retained in the receptacle in an installed position via a friction fit;
a housing attached to the body and removably covering the receptacle and blocking the anchor member from moving away from the installed position;
a notch in the housing configured to receive a portion of the lanyard extending away from the anchor member.

2. The assembly of claim 1 wherein the anchor member is substantially cylindrical, and wherein the receptacle is substantially cylindrical.

3. The assembly of claim 1 wherein the slope of the top surface corresponds to a portion of the body surrounding the receptacle, such that when received within the receptacle, the top surface of the anchor member is substantially coplanar with the portion of the body surrounding the receptacle.

4. The assembly of claim 1, further comprising an internal control assembly on a support member, and wherein the housing comprises front and rear covers connected to each other and enclosing the internal control assembly and the support member.

5. The assembly of claim 1 wherein the notch is formed in an end portion of the housing.

6. The assembly of claim 1 wherein the notch has a height less than a height of the anchor member.

7. The assembly of claim 1 wherein the receptacle comprises a substantially cylindrical opening with an open slot on one side configured to receive a portion of the lanyard therethrough.

8. A remote control assembly, comprising:
a body having a receptacle formed therein;
a cover attached to the body and removably covering the receptacle;
an opening formed in the cover;
an anchor member removably positioned within the receptacle via a friction fit, wherein a portion of the cover extends over the anchor member, the anchor member having a top surface, a bottom surface, and a side surface extending between the top surface and the bottom surface, wherein the top surface is sloped with respect to the bottom surface;
a lanyard coupled to the anchor member such that a portion of the lanyard is molded into the anchor member, the lanyard extending away from the receptacle and through the opening in the cover.

9. The assembly of claim 8 wherein the anchor member comprises a substantially cylindrical body.

10. The assembly of claim 8 wherein the slope of the top surface corresponds to a portion of the body surrounding the receptacle, such that when received within the receptacle, the top surface of the anchor member is substantially coplanar with the portion of the body surrounding the receptacle.

11. The assembly of claim 8 wherein the receptacle comprises a substantially cylindrical opening with an open slot on one side configured to receive a portion of the lanyard therethrough.

12. A method for manufacturing a lanyard attachment mechanism, the method comprising:
forming a remote control body portion having a receptacle disposed therein and a cover removably attachable to the remote control body portion to cover the receptacle; and
forming an anchor member configured to be removably received within the receptacle via a friction fit, the anchor member having a lanyard fixedly attached thereto such that a portion of the lanyard is molded into the anchor member,
wherein the anchor member has a top surface, a bottom surface, and a side surface extending between the top surface and the bottom surface, and wherein the top surface is sloped with respect to the bottom surface.

13. The method of claim 12, further comprising:
disposing the anchor member within the receptacle; and
attaching the cover to the remote control body portion over the receptacle, thereby securing the anchor member in place within the receptacle.

14. The method of claim 13 wherein disposing the cover over the receptacle comprises disposing the cover over the receptacle such that a notch formed within the cover is aligned with and receives a portion of the lanyard therethrough.

15. The method of claim 14 wherein the notch has a height less than a height of the anchor member.

16. The method of claim 12 wherein the receptacle comprises a substantially cylindrical opening with a slot on one side configured to receive a portion of the lanyard therethrough.

17. The method of claim 16 wherein the anchor member comprises a substantially cylindrical body.

* * * * *